(12) United States Patent
Mathew et al.

(10) Patent No.: US 8,575,588 B2
(45) Date of Patent: Nov. 5, 2013

(54) PHASE CHANGE MEMORY CELL WITH HEATER AND METHOD THEREFOR

(75) Inventors: Leo Mathew, Austin, TX (US); Dharmesh Jawarani, Round Rock, TX (US); Tushar P. Merchant, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/238,791

(22) Filed: Sep. 21, 2011

(65) Prior Publication Data

US 2012/0007031 A1   Jan. 12, 2012

Related U.S. Application Data

(62) Division of application No. 12/016,733, filed on Jan. 18, 2008, now Pat. No. 8,043,888.

(51) Int. Cl.
*H01L 45/00* (2006.01)

(52) U.S. Cl.
USPC ..................................... 257/4; 257/E45.002

(58) Field of Classification Search
USPC .......................................... 257/4, E45.002, 2
See application file for complete search history.

(56) References Cited

U.S. PATENT DOCUMENTS

| | | | |
|---|---|---|---|
| 4,599,705 A | 7/1986 | Holmberg et al. | |
| 5,780,919 A | 7/1998 | Chua et al. | |
| 6,221,764 B1 * | 4/2001 | Inoue | 438/649 |
| 6,319,799 B1 | 11/2001 | Ouyang et al. | |
| 6,545,287 B2 | 4/2003 | Chiang | |
| 6,605,821 B1 | 8/2003 | Lee et al. | |
| 6,800,563 B2 * | 10/2004 | Xu | 438/718 |
| 6,838,692 B1 | 1/2005 | Lung | |
| 6,846,734 B2 | 1/2005 | Amos et al. | |
| 6,967,175 B1 | 11/2005 | Ahmed et al. | |
| 7,075,131 B2 | 7/2006 | Chen | |
| 7,238,601 B2 | 7/2007 | Mathew et al. | |
| 7,479,671 B2 | 1/2009 | Breitwisch et al. | |
| 7,598,112 B2 * | 10/2009 | Park et al. | 438/95 |

(Continued)

FOREIGN PATENT DOCUMENTS

WO    WO 2006/123306    * 11/2006    ............. G11C 16/02

OTHER PUBLICATIONS

Lankhorst et al., "Low-cost and nanoscale non-volatile memory concept for future silicon chips", Nature Materials, vol. 4, Apr. 2005, pp. 347-352.*

(Continued)

*Primary Examiner* — Stephen W Smoot
*Assistant Examiner* — Sun M Kim
(74) *Attorney, Agent, or Firm* — James L. Clingan, Jr.; David G. Dolezal

(57) ABSTRACT

A method for forming a phase change memory cell (PCM) includes forming a heater for the phase change memory and forming a phase change structrure electrically coupled to the heater. The forming a heater includes siliciding a material including silicon to form a silicide structure, wherein the heater includes at least a portion of the silicide structure. The phase change structure exhibits a first resistive value when in a first phase state and exhibits a second resistive value when in a second phase state. The silicide structure produces heat when current flows through the silicide structure for changing the phase state of the phase change structure.

15 Claims, 6 Drawing Sheets

(56) References Cited

U.S. PATENT DOCUMENTS

| | | | |
|---|---|---|---|
| 7,719,039 | B2 | 5/2010 | Muralidhar et al. |
| 7,811,851 | B2 | 10/2010 | Muralidhar et al. |
| 2005/0023633 | A1 | 2/2005 | Yeo et al. |
| 2005/0029503 | A1 | 2/2005 | Johnson |
| 2005/0110983 | A1 | 5/2005 | Jeong et al. |
| 2006/0177998 | A1 | 8/2006 | Lin et al. |
| 2007/0069249 | A1 | 3/2007 | Hayakawa |
| 2007/0096206 | A1 | 5/2007 | Chidambarrao |
| 2007/0097738 | A1 | 5/2007 | Asano et al. |
| 2007/0161171 | A1 | 7/2007 | Burnett et al. |
| 2008/0186760 | A1 | 8/2008 | Elmegreen et al. |
| 2008/0224178 | A1 | 9/2008 | Pacha et al. |
| 2008/0251779 | A1 | 10/2008 | Kakoschke et al. |
| 2009/0184309 | A1 | 7/2009 | Mathew et al. |
| 2010/0001248 | A1 | 1/2010 | Wouters et al. |
| 2010/0117045 | A1 | 5/2010 | Lee et al. |

OTHER PUBLICATIONS

U.S. Appl. No. 12/016,739, Leo Mathew, "Phase Change Memory Cell With FinFET and Method Therefor", filed Jan. 18, 2008, Office Action—Rejection, mailed May 8, 2012.

U.S. Appl. No. 12/016,739, Inventor Leo Mathew, "Phase Change Memory Cell with Finfet and Method Therefor", filed Jan. 18, 2008, Office Action—Final Rejection, mailed Sep. 19, 2012.

Chen, et al., "Ultra-Thin Phase-Change Bridge Memory Device Using GeSb", IEDM Technical Digest, 2006, 4 pgs.

Kim, SB, et al., "Integrating Phase-Change Memory Cell with Ge Nanowire Diode for Crosspoint Memory—Experimental Demonstration and Analysis", IEEE Transactions on Electron Devices, vol. 55, No. 9, Sep. 2008, pp. 2307 and 2313.

Lankhorst, "Low-cost and nanoscale non-volatile memory concept for future silicon chips", Phillips Research Laboratories, the Netherlands, Nature Publishing Group, Apr. 2005.

Merget, et al., "Lateral phase change random access memory cell design for low power operation", Microsystems Technology Technical Paper, 2007, pp. 169-172.

Nishi, "Current Trends and Status of Nanoelectronic Devices", 2005 SINANO Workshop, Grenoble, France, 2009, 39 pgs.

Quirk, et al., "Semiconductor Manufacturing Technology", Pearson Education International/Prentice Hall, 2001, pp. 309-312.

Zhang, et al., "An Integrated Phase Change Memory Cell with Ge Nanowire Diode for Cross-Point Memory", 2007 Symposium on VLSI Technology Digest of Technical Papers, IEEE, 2007, pp. 98-99.

U.S. Appl. No. 12/016,739, Office Action—Restriction, May 10, 2010.

U.S. Appl. No. 12/016,739, Office Action—Rejection, Jul. 26, 2010.

U.S. Appl. No. 12/016,739, Office Action—Final Rejection, Jan. 5, 2011.

U.S. Appl. No. 12/016,739, Office Action—Rejection, Jul. 14, 2011.

U.S. Appl. No. 12/016,733, Office Action—Restriction, Aug. 21, 2009.

U.S. Appl. No. 12/016,733, Office Action—Rejection, Jan. 13, 2010.

U.S. Appl. No. 12/016,733, Office Action—Final Rejection, Jul. 22, 2010.

U.S. Appl. No. 12/016,733, Office Action—Rejection, Dec. 27, 2010.

U.S. Appl. No. 12/016,733, Office Action—Rejection, Mar. 30, 2011.

U.S. Appl. No. 12/016,733, Office Action—Notice of Allowance, May 10, 2011.

U.S. Appl. No. 12/016,733, Office Action—Notice of Allowance, Aug. 30, 2011.

US Application No. 12016739, Mathew, L., et al., "Method of Making a Phase Change Memory Cell Having a Silicide Heater in Conjunction With a FINFET", Office Action—Notice of Allowance, mailed Jul. 9, 2013.

* cited by examiner

PHASE CHANGE MEMORY CELL WITH HEATER AND METHOD THEREFOR

CROSS-REFERENCE TO RELATED APPLICATION(S)

This application is related to U.S. patent application Ser. No. 12/016,739, filed on even date herewith, entitled "Phase Change Memory Cell with FinFET and Method Therefor," naming Leo Mathew, Tushar Merchant, Ramachandran Muralidhar, and Rajesh Rao as inventors, and assigned to the current assignee hereof.

BACKGROUND

1. Field

This disclosure relates generally to integrated circuit memories, and more specifically, to phase change memory cells.

2. Related Art

A relatively new type of memory known as a phase change memory has been introduced which offers some advantage over existing non-volatile memories (NVMs). The phase change memory operates on the principle that there are phase change materials (PCMs) that change resistance upon a phase change and this change in resistance is reversible. One such material is a combination of germanium, antimony, and tellurium and is known as GST. The PCM is heated for a relatively short time and quickly cooled to achieve an amorphous state, which is high resistance. The PCM is heated at a lower temperature but for a longer time to achieve a crystalline state, which is low resistance. The difference in resistance is detectable and thus useful for defining two different logic states. One of the difficulties, however, is obtaining enough heat in order to achieve the amorphous state. Typically, heaters are metal that are either over and under the PCM or where the metal makes contact to the PCM in two locations on the top side. In the case of over and under, there are then multiple levels of vias required just to contact the PCM. In the case of both vias on the top side, the PCM must be big enough to have two contacts made to it. Also the contacts are preferably tapered to increase the resistance and thus the heat. Resistance is preferably not too low because the current is limited by transistors so that the heat is directly related to the resistance over an operable range.

Another issue with this type of memory is that contact between the PCM and a transistor must be made. The PCM must also make contact to a reference or a bit line. In either case that means that vias are required for two locations on a PCM.

Thus, there is a need for improving upon the issues pointed out above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a semiconductor device has a phase change material (PCM) contacted by silicide on silicon. The silicon is shaped so as to provide high resistance and the silicide is formed after the silicon has been shaped. Thus, the shaping is achieved using silicon which is easier to form into a desired shape than metal typically is. A silicide material, which is better for being a heater for the PCM, is then formed into the desired shape formed in the silicon. In another aspect, a silicon fin is used for both a select transistor and the silicon used for providing the high resistance shape. This is better understood by reference to the drawings the following description.

In another aspect, a circuit has a FinFET transistor which is coupled to a phase change memory cell. The fin that is used in forming the FinFET has a portion that is silicided. The silicided portion is used as the heater for the phase change memory cell. This is better understood by reference to the drawings the following description.

Figure 1:
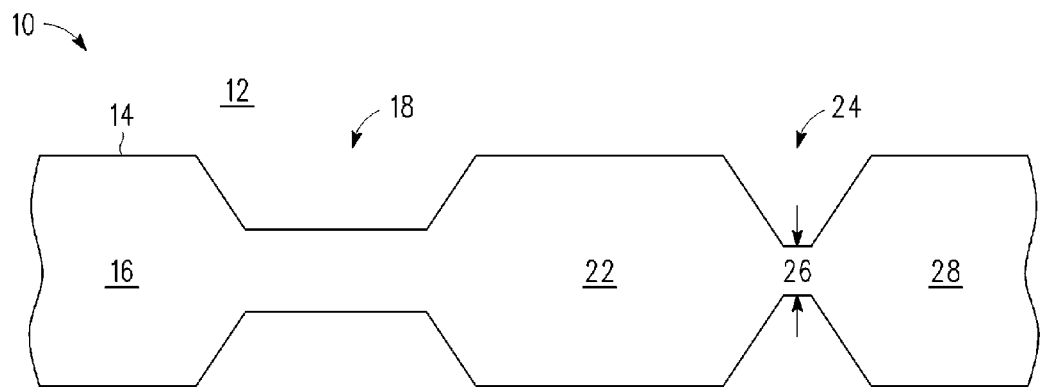
FIG. 1 is a top view of a semiconductor device at a stage in processing according to an embodiment.

Shown in FIG. 1 is a semiconductor device 10, having an insulating layer 12, and a fin 14 over insulating layer 12. Fin 14 has a source/drain portion 16, a source/drain portion 22, and a contact portion 28. Between source/drain portions 16 and 22 is a channel region 18 that has reduced width. Between source/drain region 22 and contact region 28 is a PCM region where a PCM will be formed. PCM region 24 has a width 26 which may be for example, 15 to 20 nanometers (nm). Regions 16, 22, and 28 are intentionally not rectangular with 90 degree corners. The corner angles may be 45 degrees. In this case of regions 22 and 28, the corners are leading to region 24 are at angle so as to provide a shape that is better for heating. Regions 16 and 22 are angled away from channel region 18 to reduce capacitance between the gate and drain and between the gate and source. Fin 14 in this example is preferably monocrystalline silicon but may be another material preferably suitable for transistor and silicide formation.

Figure 2:
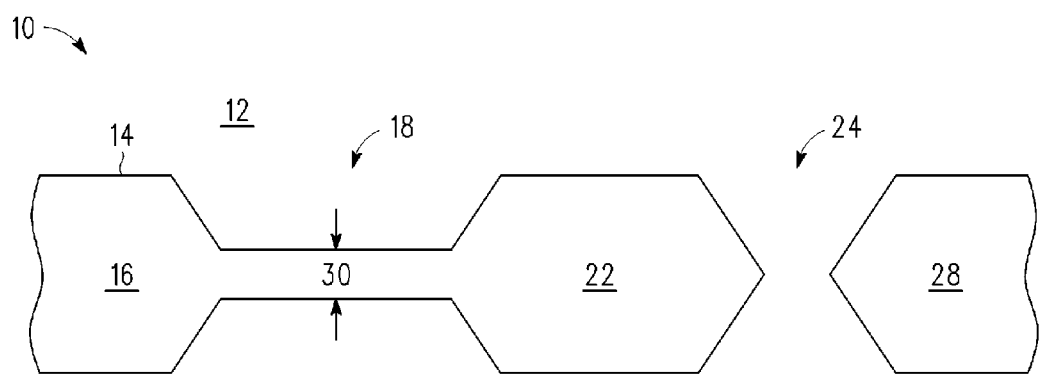
FIG. 2 is a top view of the semiconductor device of FIG. 1 at a subsequent stage in processing.

Shown in FIG. 2 is semiconductor device 10 after a trimming step which is an unmasked isotropic etch step. An effective etchant is a dry etch using bromine or chlorine. The result of the isotropic etch is to reduce fin 14 in all three dimensions and removing the silicon between regions 22 and 28. This leaves regions 22 and 28 with points at the interface with region 24. This is an effective shape for generating heat with current flow through the point areas. This shape increases the current density and thus the heat. Channel region 18 is thinned to a width 30 as the desirable width for fin 14 at the channel, which may be 15 nm. Regions 16 and 28 remain large enough so that contacts may be formed on them.

Region 22 is shaped for heat on the side next to PCM region 24 and reduced capacitance on the side adjacent to channel region 18.

Figure 3:
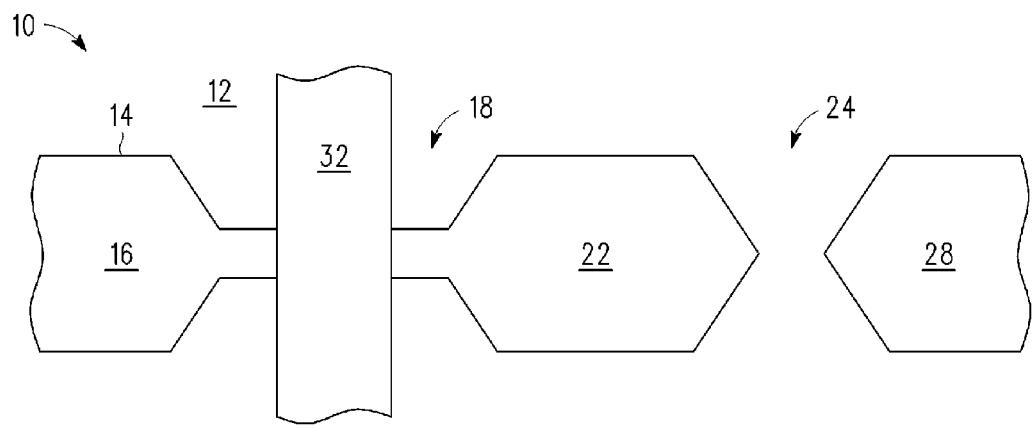
FIG. 3 is a top view of the semiconductor device of FIG. 2 at a subsequent stage in processing.

Shown in FIG. 3 is semiconductor device 10 after forming a gate stack 32 over channel region 18. Gate stack 32 includes a gate dielectric on channel region 18 and a gate electrode 32 on the gate dielectric. The gate dielectric may be oxide but also may be another insulating layer useful for gate dielectrics such high k dielectrics. Gate electrode 32 may be just polysilicon but may also be metal or combination of metal layers and may or may not further include polysilicon. The width of gate stack 32 is used in determining the channel length for the transistor to be formed using channel region 18, gate stack 32, source/drain region 16, and source/drain region 22. Transistors using fins, known as FinFETs, typically would not be expected to have extension implants, but if an extension implant is desired, it may be done to semiconductor 10 shown in FIG. 3.

Figure 4:
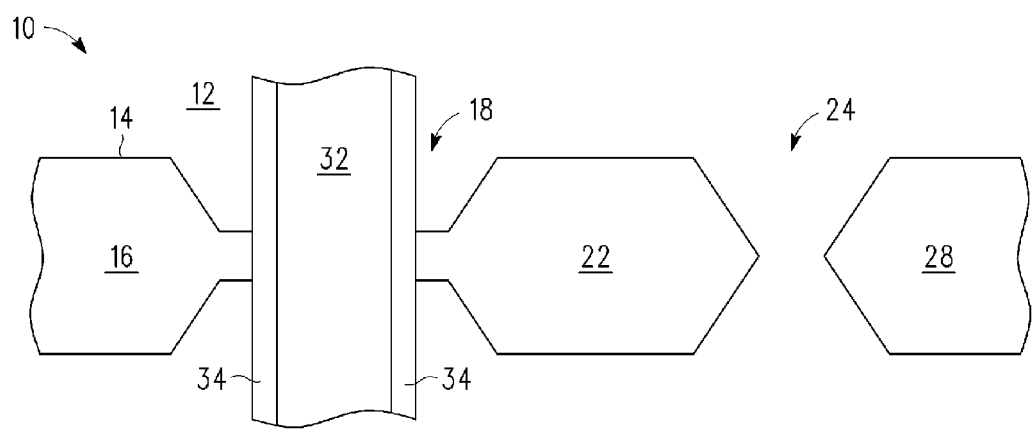
FIG. 4 is a top view of the semiconductor device of FIG. 3 at a subsequent stage in processing.

Shown in FIG. 4 is semiconductor device 10 after forming a sidewall spacer 34 around gate stack 32. A source/drain implant is performed on semiconductor device 10 as shown in FIG. to form deep source/drains. Subsequent processing is sufficient to cause the implanted regions to expand.

Figure 5:
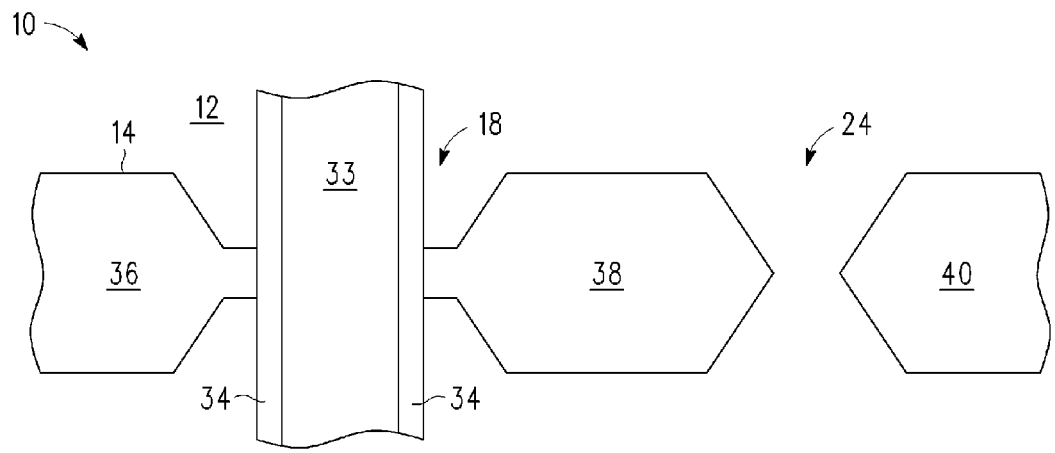
FIG. 5 is a top view of the semiconductor device of FIG. 4 at a subsequent stage in processing.

Shown in FIG. 5 is semiconductor device 10 after forming silicide region 36 in source/drain region 16, silicide region 38 in source/drain region 22, silicide region 33 in gate stack 32, and silicide region 40 in contact region 28. Sidewall spacer 34 provides insulation between gate stack 32 and the siliciding of source/drain regions 36 and 38. The silicide used may be cobalt silicide. Cobalt silicide is beneficial due to its thermal stability. Other silicides may also be effective.

Figure 6:
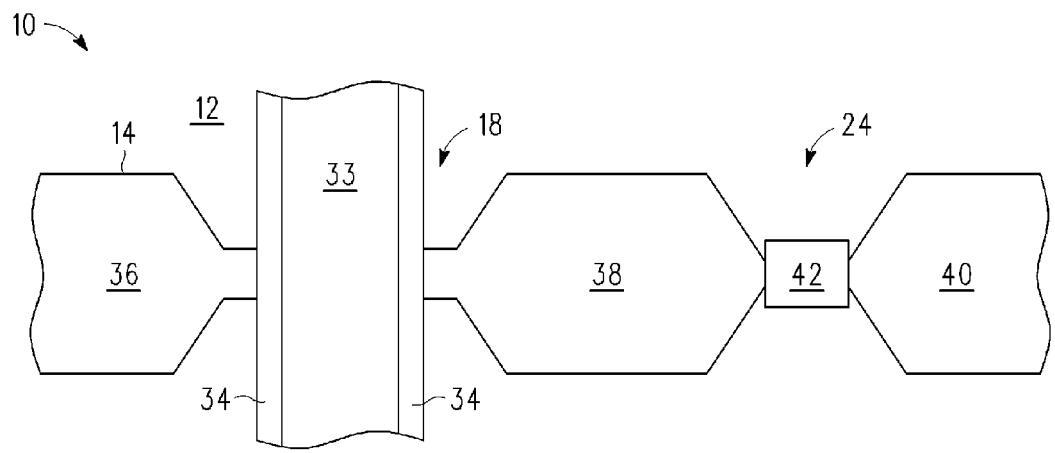
FIG. 6 is a top view of the semiconductor device of FIG. 5 at a subsequent stage in processing.

Shown in FIG. 6 is semiconductor device 10 after forming a PCM 42 in PCM region 24 contacting silicide regions 38 and 40. PCM 42 may be a combination of germanium, atimony, and tellurium (GST). The amount of silicide contacting PCM 42 is quite small as regions 38 and 40 come to a point where PCM 42 is contacted.

Figure 7:
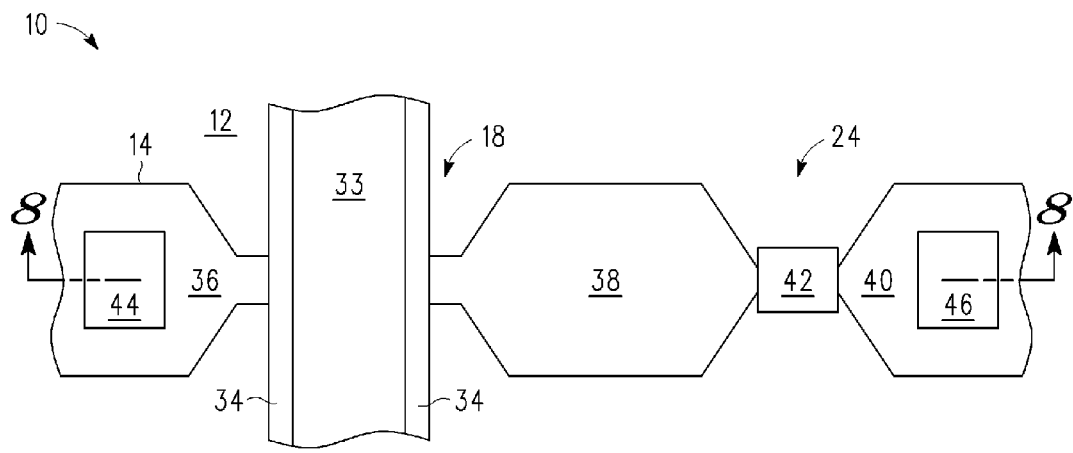
FIG. 7 is a top view of the semiconductor device of FIG. 6 at a subsequent stage in processing.

Shown in FIG. 7 is semiconductor device 10 after forming contact 44 on silicide region 36 and contact 46 on silicide region 40. There is also a contact to silicide region 33 at a location away from channel region 18 not shown in FIG. 7. Semiconductor device 10 of FIG. 7 is a completed PCM cell which can be included in a memory array.

Figure 8:
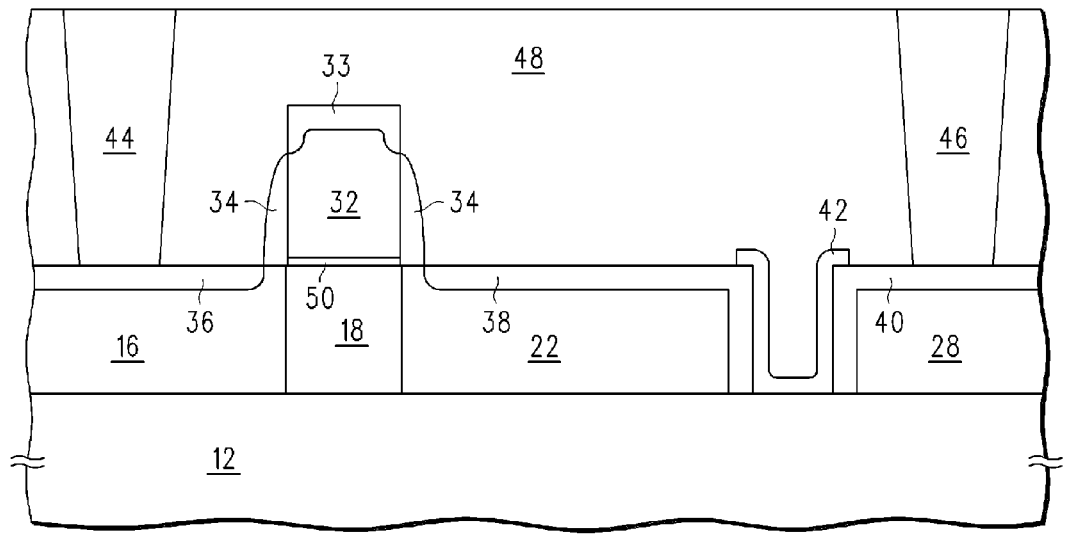
FIG. 8 is a cross section of the semiconductor device of FIG. 7.

Shown in FIG. 8 is a cross section of semiconductor device 10 of FIG. 7 through 7-7 shown in FIG. 7. This shows contacts 44 and 46 through an interlayer dielectric layer (ILD) 48 which is deposited over silicide regions 36, 33, 38, and 40, sidewall spacer 34, and PCM 42. PCM 42 can be relatively thin such as 20 nm. PCM 42 is along the pointed edge of silicide regions 38 and 40. Silicide regions 36, 33, 38 and 40 penetrate into source/drain region 36, gate stack 32, source/drain region, and contact region 28, respectively. The penetration may be 20 nm. The diffusion of the source/drain implant, which is used in defining the channel length, is shown to almost to line up with gate stack 32, which is sufficient for transistor operation. The fin height may be 100 nm. With cobalt silicide as the silicide, the pointed area contacting PCM 42 is more highly resistive than some silicides and thus makes a better heater. On the other hand, cobalt silicide is still relatively low resistance making a good contact surface for contacts 44 and 46 making contact to source/drain region 16 and contact region 46. Further cobalt silicide has high thermal stability which makes it particularly useful as a heater. Thus, cobalt silicide is believed to have particular benefits but other silicides may also be found to be effective. Thus, a PCM cell has a transistor connected to PCM 42 which can provide the current needed by application of the proper voltages to contacts 44 and 46 and to a contact that electrically contacts gate stack 32. After programming, the transistor formed of source/drains 16 and 22 and gate stack 32 can providing coupling of PCM 42 to a bit line of a memory array.

With contact region 28 and drain region 22 being symmetric with each other at the interface with PCM region 24, heating occurs from silicide region 38 in contact with PCM 42 and silicide region 40 in contact with PCM 42 substantially equally. This heating from both sides helps lower the overall power consumption of the device, especially when the PCM is confined to a small volume. In many cases in the prior art, especially with vertical heating, heating only occurs from one side. Thus the heating of the PCM is uneven and can result in inadequate heating in some portion of the PCM and/or undesirably slow heating.

Figure 9:
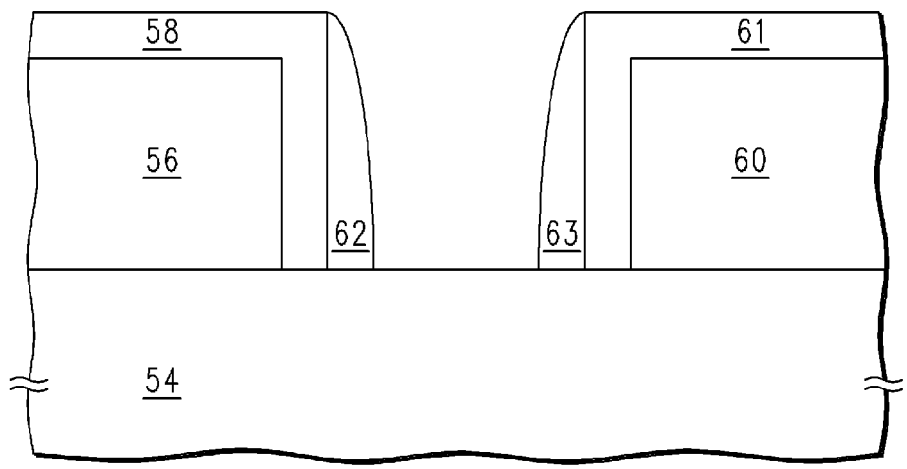
FIG. 9 is a cross section of a portion of a semiconductor device at a stage in processing according to another embodiment.

Shown in FIG. 9 is an alternative PCM structure 52, shown in cross section, to that shown in FIGS. 1-8 for PCM region 24 and PCM 42. PCM structure 52 has a source/drain region 56 with a silicide layer 58 in it and a contact region 60 which has a silicide layer 61 in it. Regions 56 and 60 and thus silicide layers 58 and 61 come to a point as shown for regions 22, 28, 38, and 40 shown in FIGS. 1-8. PCM structure 52 further includes sidewall spacers 62 and 63 that are formed of a metal different from that used in forming silicide layers 58 and 61. In this example, silicide layers 58 and 61 are chosen for optimizing their use for contacting, and sidewall spacers 62 and 63 are chosen for optimizing the use as a heater. For example, silicide layers 58 and 61 may be nickel silicide and sidewall spacers 62 and 63 may be tantalum silicide. Titanium nitride and tantalum nitride could also be useful heater materials for sidewall spacers 62 and 63. Use of sidewall spacers 62 and 63 are formed in the convenient manner of conformal deposition and anisotropic etch back that contours the resulting structure to the shape of the existing sidewall that does not require the benefits of the selective deposition provided by siliciding. Thus the materials for sidewall spacers 62 and 63 are not constrained to being a silicide. A variety of issues may be involved in optimizing the materials for silicide layers 58 and 61 and sidewall spacers 62 and 63 other than just resistance. Thermal stability is one. Another is resistance to diffusion.

Figure 10:
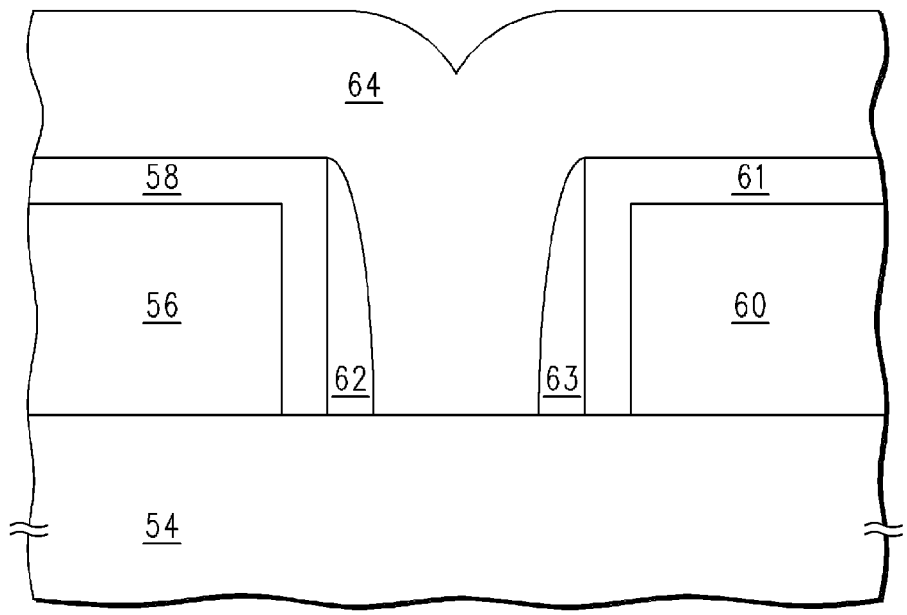
FIG. 10 is a cross section of the portion of the semiconductor device of FIG. 9 at a subsequent stage in processing.

Shown in FIG. 10 is PCM structure 52 after depositing PCM material to form PCM layer 64. PCM layer 64 is deposited to a thickness a little greater than half the amount of the opening between sidewall spacers 62 and 63. This results in filling the opening so that PCM layer 64 is thicker over the opening than over silicide regions 58 and 61.

Figure 11:
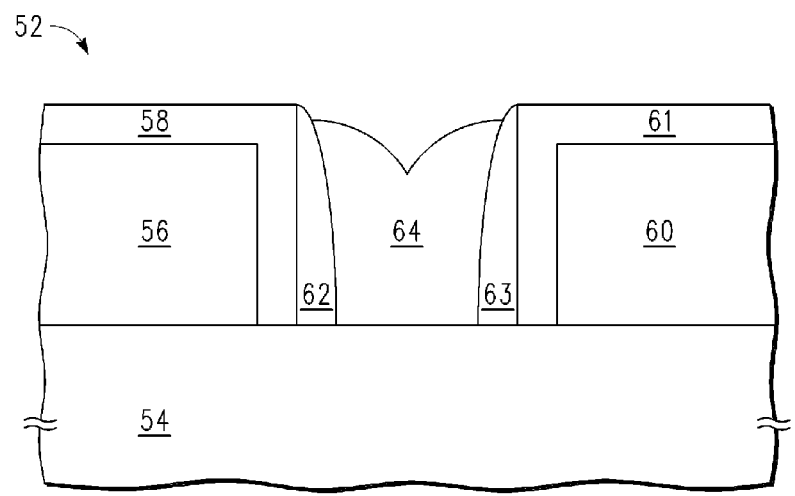
FIG. 11 is a cross section of the portion of the semiconductor device of FIG. 10 at a subsequent stage in processing.

Shown in FIG. 11 is PCM structure 52 after performing an anisotropic etch performed sufficiently long to remove PCM layer 64 from silicide layers 58 and 61. It may desirable to continue etching until layer 64 is as thin as possible without separating. By having PCM layer 64 below sidewall spacers 62 and 63, all of the programming current from source/drain regions 56, contact region 60, and silicide regions 58 and 61 will pass through sidewall spacers 62 and 63 which were optimized for heating. It is desirable to recess PCM layer 64 so that PCM layer 64 did not contact silicide layer 58 or 61. If PCM layer 64 were left in contact with silicide layers 58 and 61, much of the programming current would pass directly from silicide layers 58 and 61 into PCM layer 64 thus bypassing sidewall spacers 62 and 63. This would result in losing at least some of the benefit of using sidewall spacers 62 and 63.

By now it should be appreciated that there has been provided a method for forming a phase change memory cell (PCM) includes forming a heater for the phase change memory and forming a phase change structrure electrically coupled to the heater. The forming a heater includes siliciding a material including silicon to form a silicide structure, wherein the heater includes at least a portion of the silicide structure. The phase change structure exhibits a first resistive value when in a first phase state and exhibits a second resistive value when in a second phase state. The silicide structure produces heat when current flows through the silicide structure for changing the phase state of the phase change structure. The method may be further characterized by the forming the heater including patterning a layer including silicon to form a patterned structure, wherein the siliciding a material including silicon includes siliciding at least a portion of the patterned structure. The silicon may be located over an insulator layer of a wafer, wherein the patterning the layer including silicon includes exposing the insulator layer. The forming the phase change material may include forming a layer of phase change material, and patterning the layer phase change material to leave a phase change material over the silicide and over portions of the wafer where the layer of silicon was removed during the patterning of the layer including silicon. The forming the heater may include thinning the patterned structure prior to the siliciding, wherein the thinning reduces the width of the patterned structure. The thinning may include oxidizing portions of the patterned structure and removing at least portions of the oxidized portions to expose unoxidized portions of the patterned structure, wherein the siliciding includes forming silicide from the unoxidized portions. The siliciding may include forming a layer of metal over the material including silicon and reacting the layer of metal with the material including silicon, wherein the forming a layer of metal includes forming the layer over a second area of material including silicon and the reacting includes reacting the layer of metal with material of the second area to form a second silicide structure, and the method may then include forming an electrical contact for an electrode of a transistor, the electrical contact electrically connected to the second silicide structure. The silicide may include cobalt. The silicide may include at least one of the group consisting of tantalum and tungsten.

Also described is a circuit comprising phase change memory device that includes a phase change memory cell that has a phase change memory structure and a heater. The phase change memory structrure includes material exhibiting a first resistive value when in a first phase state and exhibiting a second resistive value when in a second phase state. The heater is electrically coupled to the phase change memory structure. The heater includes a silicide structure for producing heat when current flows through the silicide structure for changing the phase state of the phase change memory structure. The circuit may include a structure including silicon in which the silicide is formed on they structure including silicon. A portion of the phase change memory structure may be located over the heater and a second portion is located over and is in physical contact with a dielectric structure. The circuit may further comprise a transistor including a channel region in the structure including silicon. The circuit may further comprise a transistor and a contact electrically coupled to an electrode structure of the transistor in which the contact is electrically in contact with a silicide electrode structure of the transistor that includes a metal and the silicide of the heater includes the same metal. The heater may include a second silicide structure physically separate from the silicide structure and the phase change memory structure electrically couples the silicide structure and the second silicide structure. The heater may include a metal spacer located between the silicide structure and the phase change material in which the metal spacer produces heat for changing the phase state of the phase change material when current flows through the metal spacer for changing the phase state of the phase change memory structure. The silicide structure may include a portion located on a sidewall of a structure including silicon.

Described too is a method for making a circuit including a phase change memory cell. A wafer is provided with a layer including silicon over an insulator. The layer is patterned to form a patterned structure, wherein the patterning leaves portions of the insulator exposed. The patterned structure is oxidized to form an oxide layer on the patterned structure. The oxide layer is removed from at least of first area of the patterned structure. A layer of metal is formed over the first area and the layer of metal is reacted with the silicon in the first area to form a silicide structure. The layer of phase change material is patterned to form a phase change memory structure. The phase change structure exhibits a first resistive value when in a first phase state and exhibits a second resistive value when in a second phase state. The phase change memory structure is electrically coupled to the silicide. When current flows through the silicide, the silicide produces heat to change the phase state of the phase change memory structure. The silicide structure may include cobalt. The forming a layer of metal may include forming the layer over a second area of the patterned structure. The reacting may include reacting the layer of metal with material of the second area to form a second silicide structure. The method may include forming an electrical contact for a terminal of a transistor in which the electrical contact is electrically connected to the second silicide structure.

Although the invention is described herein with reference to specific embodiments, various modifications and changes can be made without departing from the scope of the present invention as set forth in the claims below. For example, several alternatives for the heater were described but yet other alternatives may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit including a phase change memory device, the circuit comprising:
   a phase change memory cell, the phase change memory cell including:
      a phase change memory structure, the phase change memory structure including material over an insulating layer, the material exhibiting a first resistive value when in a first phase state and exhibiting a second resistive value when in a second phase state;

a heater electrically coupled to the phase change memory structure, wherein the heater includes a silicide structure for producing heat when current flows through the silicide structure for changing a phase state of the phase change memory structure, wherein:

the silicide structure having a bottom surface directly on the insulating layer and a top surface above the bottom surface that comprises a first silicided region narrowing to a first pointed edge extending from the bottom surface directly on the insulating layer to the top surface and a second silicided region narrowing to a second pointed edge extending from the bottom surface directly on the insulating layer to the top surface, wherein the first and second pointed edges are in parallel and are vertical with respect to the bottom surface;

the first pointed edge is separated from the second pointed edge;

the first pointed edge and the second pointed edge contact the phase change memory structure; and current flows from the first pointed edge to the second pointed edge for producing the heat.

2. The circuit of claim 1 further comprising:

a structure including silicon, the silicide structure formed on the structure including silicon.

3. The circuit of claim 2 further comprising;

wherein the material has a first portion covering the first pointed edge, a second portion covering the second pointed edge, and third portion directly on the insulating layer connecting the first portion and the second portion.

4. The circuit of claim 2 further comprising:

a transistor, the transistor including a channel region in the structure including silicon.

5. The circuit of claim 1 further comprising:

a transistor;

a contact, electrically coupled to an electrode structure of the transistor, wherein the contact is electrically in contact with a silicide electrode structure of the transistor that includes a metal, wherein the silicide structure of the heater includes the same metal.

6. The circuit or claim 1 wherein the heater includes a metal spacer located between the silicide structure and the phase change memory structure, the metal spacer producing heat for changing the phase state of the phase change memory structure when current flows through the metal spacer.

7. The circuit of claim 1 wherein the silicide structure includes a portion located on a sidewall of a structure including silicon.

8. A circuit including a phase change memory device, the circuit comprising:

a phase change memory cell, the phase change memory cell including:

a phase change memory structure, the phase change memory structure over an insulating layer, the phase change memory structure including material exhibiting a first resistive value when in a first phase state and exhibiting a second resistive value when in a second phase state; and a heater electrically coupled to the phase change memory structure, wherein the heater includes a silicide structure having a bottom surface directly on the insulating layer and a top surface above the bottom surface for producing heat when current flows through the silicide structure for changing a phase state of the phase change memory structure, wherein:

the silicide structure comprises a first silicided region narrowing to a first pointed edge running vertically from the bottom surface directly on the insulating layer to the top surface and a second silicided region narrowing to a second pointed edge running vertically from the bottom surface directly on the insulating layer to the top surface;

the first pointed edge is separated from the second pointed edge;

the heater is directly connected to the phase change memory through the first pointed edge and the second pointed edge; and current flows from the first pointed edge to the second pointed edge for producing the heat.

9. The circuit of claim 8, wherein the heater further comprises a first metallic sidewall spacer on the first pointed edge and a second metallic sidewall spacer on the second pointed edge.

10. The circuit of claim 9, wherein the first metallic sidewall spacer is in direct contact with a first side of the phase change memory structure and the second metallic sidewall spacer is in direct contact with a second side of the phase change memory structure.

11. The circuit of claim 10, wherein the first and second silicided regions comprise nickel.

12. The circuit of claim 11, wherein the first and second metallic sidewalls comprise one of a group consisting of titanium and tantalum.

13. The circuit of claim 12, wherein the first silicided region is separated from the phase change memory structure by the first metallic sidewall spacer and the second silicided region is separated from the phase change memory structure by the second metallic sidewall spacer.

14. The circuit of claim 8, wherein the first and second silicided regions comprise cobalt.

15. The circuit of claim 14, wherein the first pointed edge and the second pointed edge are covered by the material.

* * * * *